United States Patent [19]

Elliott et al.

[11] Patent Number: 4,873,762

[45] Date of Patent: Oct. 17, 1989

[54] COMPONENT INSERTION MACHINE APPARATUS

[75] Inventors: William A. Elliott, Reynoldsburg; Richard A. Greene, Pickerington; Robert P. Kennedy, Columbus; Robert P. Poe, Jr., Columbus; William H. Steece, Columbus, all of Ohio

[73] Assignee: American Telephone and Telegraph Company, AT&T-Technologies Inc., Berkeley Heights, N.J.

[21] Appl. No.: 265,378

[22] Filed: Oct. 31, 1988

Related U.S. Application Data

[62] Division of Ser. No. 190,976, May 6, 1988, Pat. No. 4,831,696.

[51] Int. Cl.$^4$ .................. B23P 19/00; B23Q 7/10; B65H 31/20; H05K 3/30
[52] U.S. Cl. ......................... 29/809; 29/740; 221/197; 221/241

[58] Field of Search ................. 29/809, 740, 739, 741, 29/771, 759, 564.1, 33 M, 564; 221/197, 198, 302, 241, 242, 171; 414/125, 126

[56] References Cited

U.S. PATENT DOCUMENTS

| | | | |
|---|---|---|---|
| 4,222,166 | 9/1980 | Kurek et al. | 221/301 |
| 4,401,234 | 8/1983 | Droira et al. | 221/279 |
| 4,488,662 | 12/1984 | Fanning | 29/809 |
| 4,567,652 | 2/1986 | Gussman et al. | 29/809 X |
| 4,653,665 | 3/1987 | Heisner et al. | 221/104 X |

Primary Examiner—William Briggs
Attorney, Agent, or Firm—Dwight A. Marshall

[57] ABSTRACT

Apparatus for loading components into a component insertion machine. The apparatus comprises structure releasably mounted on component magazine loading apparatus to retain components in component magazines received by and aligned in the component magazine loading apparatus. The structure is removable after installation of the component loading apparatus on the component insertion machine to enable components to be selected by the component insertion machine from the component magazines.

5 Claims, 1 Drawing Sheet

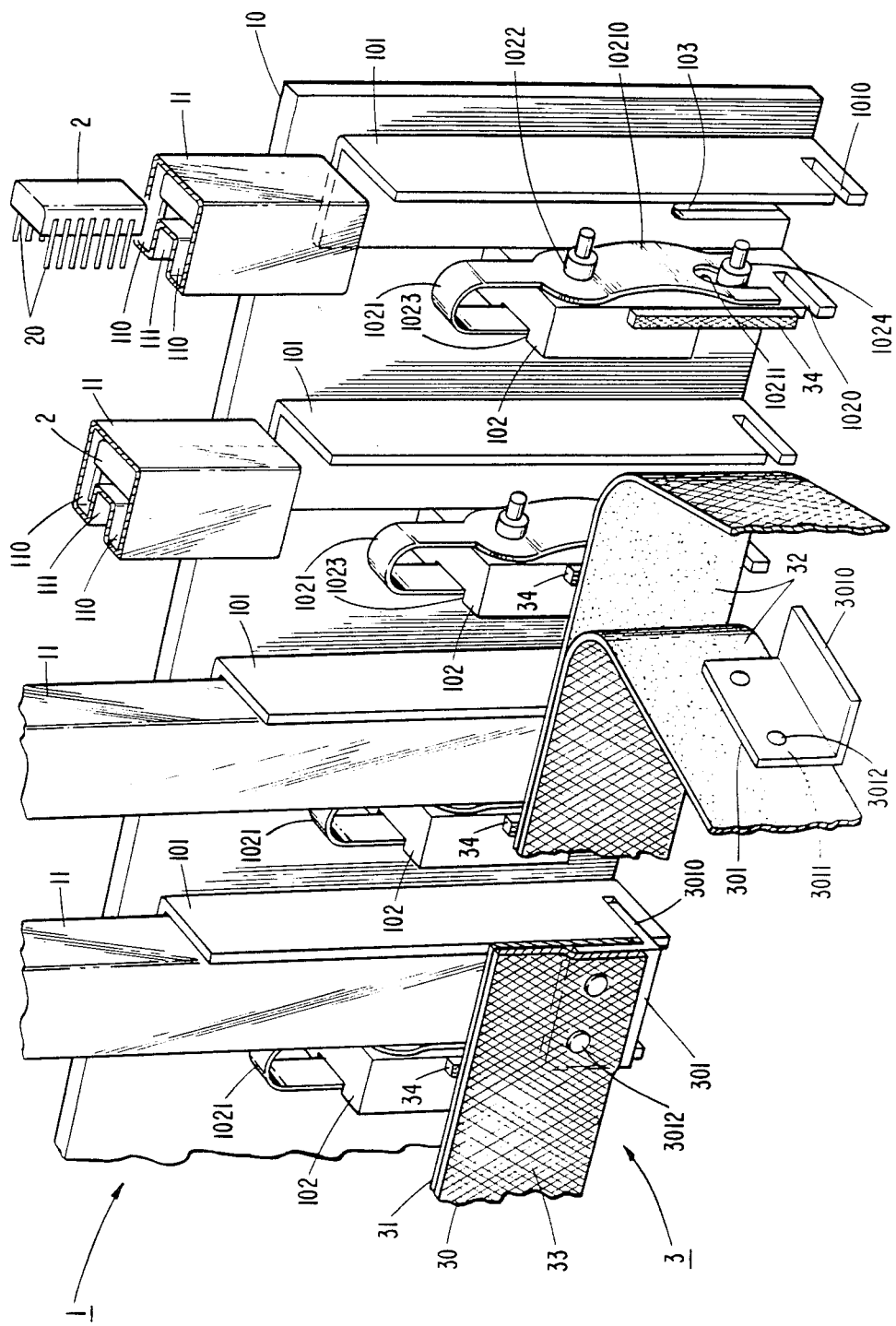

COMPONENT INSERTION MACHINE APPARATUS

This is a division of application Ser. No. 190,976 filed May 6, 1988, U.S. Pat. No. 4,831,696.

TECHNICAL FIELD

The invention relates to apparatus for loading components into component insertion machines.

BACKGROUND AND PROBLEM

Circuit boards are widely used in the manufacture of electrical and electronic equipment. Such circuit boards are prepared with printed wiring that is used to interconnect electrical components located on the circuit boards, such as dual-in-line devices. Components may be inserted into plated-through holes of the circuit boards and affixed thereto to form connection with the printed wiring to create a composite circuit used in the operation of the equipment. In another variation, components may be plugged into a socket that is located on the circuit board and affixed to the printed-wiring thereof.

Component insertion machines are used in the manufacture of the circuit boards to automatically insert components previously loaded into component magazines onto the circuit boards. Typical component insertion machines usually have a number of component magazines installed thereof from which components are selected and inserted into a circuit board in accordance with programmed instructions controlling the operation of the component insertion machine. In the operation of the component insertion machine, the machine automatically checks the presence of components in a component magazine. When a component magazine is empty, the operator removes the empty component magazine and replaces it with another. A problem arises in the loading procedure in that component magazines are open at both ends to facilitate the loading of the components into the component magazines and to enable ones of the loaded components to be selected by the component insertion machine. Thus, the operator is required to hold a finger over an open end while the component magazine is being loaded into the component insertion machine to prevent components from falling out of the component magazines. Another problem arises in that it is desirable to reduce machine set-up time by loading multiple component magazines into loading apparatus at a single station and install the multiple component magazines loaded into the loading apparatus in a single operation into a component insertion machine.

SOLUTION

The foregoing problems are solved and component insertion machines are substantially enhanced by structure for releasably mounting component retention members on component loading apparatus to retain components in component magazines. The structure is removable after installation of the loading apparatus on a component insertion machine to disengage the component retention members therefrom to enable components to be selected by the component insertion machine and inserted into circuit boards.

In accordance with the instant invention, component loading apparatus has guide members for slidably receiving and aligning component magazines with a component insertion machine. A flexible member having component retention members affixed thereto at locations corresponding with co-operating pairs of the guide members is formed with adhesive material for releasably mounting the flexible member on the component loading apparatus by engaging adhesive strips affixed to the guide members such that the component retention members engage the guide members to retain components in the received component magazines. The flexible member is removable after installation of the component loading apparatus on the component insertion machine to disengage the component retention members from the guide members and thereby enable one of the components to be selected by the component insertion machine from the received component magazines for installation on a circuit board.

BRIEF DESCRIPTION OF THE DRAWING

The figure is a perspective view of component loading apparatus having novel structural features in accordance with the invention for loading component magazines into a component insertion machine.

DETAILED DESCRIPTION

Circuit boards oftentimes use components 2, such as dual-in-line devices, having terminals 20 that are intended to be inserted into holes of a circuit board and soldered or affixed to printed wiring of the circuit board to form composite electrical and electronic circuits. In the manufacturing process for circuit boards, components 2 are loaded into a channel of component magazines 11 having a generally U-shaped configuration wherein the bodies of components 2 are loaded into the channel such that the component terminals 20 extend into corresponding legs 110. The construction of component magazines 11 are such that both ends are open so that components 2 may be loaded into or removed therefrom.

In the operation of a component insertion machine, component magazines 11 are installed in component loading apparatus 1 having a panel member 10 for use in assembling and installing the apparatus on the component insertion machine. Panel member 10 has a plurality of guide members 101, 102 located thereon for slidably receiving component magazines 11 and aligning each received magazine 11 with the component insertion machine. The guide members each have one guide member, hereinafter referred to as right guide member 101, located on panel 10 for aligning a component magazine 11 with the component insertion machine. Right guide member 101 may be a molded integral part of panel 10 or may be a generally L-shaped configured member affixed to panel 10 by any of a number of well known ways such, for example, as welding right guide member 101 to back panel 10. Slots 103 formed on panel 10 and on ones of right guide members 101 or clamp members, not shown, may be used to install component loading apparatus 1 on a component insertion machine.

Other guide members, such as left guide members 102, are each located on panel 10 in co-operation with a right guide member 101 for slidably receiving a component magazine 11. Each left guide member 102 has a pair of vertically aligned pin members 1022, 1024 extending perpendicularly outward from a surface thereof toward a right guide member 101 to receive slot 111 of a component magazine 11 and guide the component magazine 11 into alignment with a right guide member 101. A spring member 1021 affixed to left guide member 102 by pin member 1022 has one end thereof formed to extend backwards into left guide member channel 1023 and the opposite end formed with a slot 10211 for receiving pin 1024. Outwardly bowed section 10210 compensates for variations that may occur in the size of the received component magazines 11 by maintaining the received component magazine 11 in alignment with a co-operating right guide member 101. Each co-operating pair of right and left guide members 101, 102 has a pair of slots 1010, 1020 each formed in a bottom portion of one of the right and left guide members 101, 102 for receiving a component retention member 301. In addition, ones of the guide members 101, 102 may have adhesive strips 34 each affixed thereto. Adhesive strips 34 may be any one of a number of adhesive materials such as a loop and hook type of material designed to releasably engage a similar type of material and may subsequently be disengaged by simply pulling the materials apart. One material that may be used is a Velcro $^{TM}$ nylon fabric material that may be fastened to itself.

Component loading apparatus 1 also has a member 30 for releasably mounting on component loading apparatus 1 to retain components 2 in component magazines 11 prior to and during the time component loading apparatus 1 is being installed on a component insertion machine. Member 30 is removable after component loading apparatus 1 is installed on the component insertion machine so that components 2 may be selected by the component insertion machine to be installed on a circuit board. Releasably mounting member 30 comprises two members each having a backing material 32 on which is positioned an adhesive material such as the aforementioned hook and loop material 31, 33. Component retention members 301, having a generally L-shaped configuration with a vertical leg 3011 and a horizontal leg 3010, are located on member 30 at locations each corresponding with co-operating pairs of guide members 101, 102.

In assembly, member 30 is releasably mounted on component loading apparatus 1 by securing the adhesive material 31 of member 30 to the adhesive strips 34 affixed to ones of guide members 101, 102 such that the horizontal leg 3010 of each component retaining member 301 is received in slots 1010, 1020 of corresponding right and left guide members 101 and 102, respectively. Each component magazine 11 containing components 2 are properly aligned for installation into a component insertion machine by right guide member 101 and are slidably received by left guide member 102 co-operating with right guide member 101. Pin members 1022, 1024 guide each received component magazine 11 into alignment with guide members 101, 102 and spring member 1021 compensates for various sizes of component magazines 11 by maintaining each received component magazine 11 in engagement with a co-operating guide member. Components 2 are retained within a received component magazine 11 by component retaining member 301 which is positioned in slots 1010, 1020 of guide members 101, 102.

Component loading apparatus 1, having member 30 releasably mounted thereon, may be taken from a component magazine loading station and installed on a component insertion machine by, for example, fitting panel slots 103 onto aligning pins on the component insertion machine. After installation, member 30 is removed by detaching member 30 from adhesive strips 34 to disengage component retention members 301 from guide member slots 1010, 1020 and thereby enable the component insertion machine to select components 2 from received component magazines 11 for insertion onto circuit boards.

While the apparatus of the invention has been disclosed with adhesive material for releasably mounting member 30 on component loading apparatus 1, it is to be understood that such an embodiment is intended to be illustrative of the principles of the invention in that numerous other arrangements may be devised by those skilled in the art without departing from the spirit and scope of the invention. For example, member 30 may be a flexible generally rectangular configured member thereby enabling ones of component retaining members 301 to be received in slots 1010, 1020 of co-operating guide members 101, 102 that may be located on panel member 10 at varying distances from adjacent pairs of co-operating guide members 101, 102. Furthermore, member 30 may be mounted on component loading apparatus 1 by releasably securing member 30 thereto using twist type snap fasteners that may be easily removed after installing component loading apparatus 1 on a component insertion machine.

What is claimed is:

1. A component insertion machine having apparatus for loading components from component magazines into the component insertion machine comprising means having adhesive members for releasably mounting said means on the component loading apparatus and having a plurality of component retention members each located on said means to correspond with ones of the component magazines for retaining components in the component magazines and removable after installation of the component loading apparatus on the component insertion machine to disengage each component retention member from said component magazines.

2. A component insertion machine having apparatus for loading components from component magazines into the component insertion machine comprising a generally rectangular configured flexible member having component retention members affixed thereto and formed with adhesive material for releasably mounting on the component loading apparatus to position each component retention member with respect to a corresponding component magazine to retain the components in the component magazines and removable from the component loading apparatus for enabling components to be selected by the component insertion machine.

3. A component insertion machine having apparatus for loading components from component magazines into the component insertion machine comprising means having retention members affixed thereto and which is formed for adhesively mounting on the component loading apparatus to engage each retention member with a component magazine for retaining the components in the component magazines when installing the component loading apparatus onto the component insertion machine and removable after installation for enabling ones of the components to be selected by the component insertion machine from the installed component magazines.

4. A component insertion machine having apparatus for loading components from component magazines into the component insertion machine comprising a member formed with adhesive material thereon for releasably mounting on the component loading apparatus to retain ones of the components in each of the component magazines when installing the component loading apparatus onto the component insertion machine and removable after installation to enable ones of the components to be selected by the component insertion machine from the component magazines.

5. A component insertion machine having apparatus for loading components from component magazines into the component insertion machine comprising a flexible member having a plurality of component retention members affixed thereto and formed with adhesive material thereon for releasably mounting on the component loading apparatus to engage each of said component retention members with one of said component magazines to retain the components in the component magazine when installing the component loading apparatus onto the component insertion machine and removable from the component loading apparatus after installation thereof to enable components to be selected by the component insertion machine.

* * * * *